United States Patent
Chen

(10) Patent No.: US 7,606,952 B2
(45) Date of Patent: Oct. 20, 2009

(54) METHOD FOR OPERATING SERIAL FLASH MEMORY

(75) Inventor: Chung Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 86 days.

(21) Appl. No.: 11/593,174

(22) Filed: Nov. 6, 2006

(65) Prior Publication Data

US 2008/0109582 A1    May 8, 2008

(51) Int. Cl.
   G06F 3/00    (2006.01)
   G06F 1/00    (2006.01)
   G06F 1/04    (2006.01)

(52) U.S. Cl. ............... 710/58; 710/60; 713/500; 713/501; 713/600

(58) Field of Classification Search .......... 710/58, 710/60; 713/500, 501, 600
See application file for complete search history.

(56) References Cited

U.S. PATENT DOCUMENTS

| | | | |
|---|---|---|---|
| 2006/0140046 A1* | 6/2006 | Koji | 365/233 |
| 2007/0182445 A1* | 8/2007 | Chen et al. | 326/39 |
| 2008/0052481 A1* | 2/2008 | Oh | 711/167 |

* cited by examiner

*Primary Examiner*—Niketa I Patel
(74) *Attorney, Agent, or Firm*—Oliff & Berridge, PLC

(57) ABSTRACT

A transmission method for a serial periphery interface (SPI) serial flash includes the steps of providing a first system clock signal and transmitting a plurality of data strings with each two bits of the data strings transmitted in a period of the first system clock signal. A second system clock signal is generated by the first system clock signal to provide a double frequency to enhance the transmission rate of all the data inputted into or outputted from the SPI serial flash.

15 Claims, 4 Drawing Sheets

METHOD FOR OPERATING SERIAL FLASH MEMORY

BACKGROUND OF THE INVENTION

1. Field of the Invention

The present invention relates to a transmission method for a serial periphery interface (SPI) serial flash, and more particularly, to a transmission method for a double data rate (DDR) serial periphery interface (SPI) serial flash.

2. Description of the Related Art

A parallel flash generally uses many pins (e.g., above 20 pins) for data input or data output, to receive power, to receive addresses and for receiving control signals. However, some of the pins are not used during operation. Using the parallel flash in a printed circuit board (PCB) or the like usually results in some issues including a large area occupied on a PCB, higher cost of the system, and more complicated control circuit. To facilitate the board design and reduce the cost, a serial flash has been developed.

FIG. 1 shows the pin assignment of an SPI serial flash 10. Compared with the parallel flash, the SPI serial flash 10 has much fewer pins. Each pin function is given briefly as follows. Pin SCK, serial clock, provides the timing of the serial interface (i.e., SPI). Commands, addresses, or input data are latched on the rising edge of the clock input, while output data is shifted out on the falling edge of the clock input. Pin SI, serial data input, transfers commands, addresses, or data serially into the SPI serial flash 10. The inputs are latched on the rising edge of the serial clock. Pin SO, serial data output, transfers data serially out of the SPI serial flash 10. Data is shifted out on the falling edge of the serial clock. Pin CE#, chip enable, enables the SPI serial flash 10 by a high to low transition thereon, and it must remain low for the duration of any command sequence. WP#, write protect, is used to enable or disable a bit to activate or de-activate the program operation. Pin HOLD#, hold, temporarily stops serial communication with the SPI serial flash 10 without resetting the SPI serial flash 10. $V_{DD}$ is a power supply voltage. $V_{SS}$ is a ground voltage.

FIG. 2 shows a known read sequence of the SPI serial flash 10. A signal CE#, chip enable, must remain active low for the duration of the read sequence. A read instruction is initiated by executing an eight-bit command (e.g., 03H), followed by 24 address bits that are indicated by three ADDs. The read command (03H) received through Pin SI takes eight periods of SCK, from period 0 to period 7. The output of the data in the 24 address bits begins on the falling edge of the 31st period of SCK until the signal CE# switches from low to high, in which each byte (eight bits) of the data takes eight periods of SCK. Pin SO remains high impedance before the output of the data. Normally, the SPI serial flash has a data output rate of 50 MHz, i.e., 50M bits/second, which is lower than the data output rate of a parallel flash. The SPI serial flash 10 with only one output pin obtains a compact board design at the expense of the data output rate. For the SPI serial flash 10, one bit of data is inputted through Pin SI in one clock period of SCK. Also, the clock rate of SCK limits the inputs of commands, addresses and data, and limits the output rates of the read data.

Another approach to improve the data output rate of the SPI serial flash is proposed, which can access data at clock rates up to 75 MHz, compared to other SPI serials flashes that typically operate from 25 MHz to 50 MHz. To double the data output rate, the input pin (i.e., Pin SI, serial data input) of the SPI serial flash is used as another output pin during the output of the data; therefore, two bits can be accessed during one clock period while keeping the same four-pin SPI interface. However, only the data output rate is doubled in this approach and all other operations are still limited by the clock rate.

SUMMARY OF THE INVENTION

The objective of the present invention is to provide a transmission method for a serial periphery interface (SPI) serial flash, which utilizes a double data rate (DDR) technique, to improve the speed of the SPI serial flash including the data output rate.

In order to achieve the objective, a transmission method for an SPI serial flash is disclosed. The transmission method comprises the steps of: providing a first system clock signal with a first frequency, doubling the first frequency of the first system clock signal to form a second system clock signal with a second frequency in the chip; and transmitting a plurality of data strings with each bit data of the data strings transmitted in a period of the second system clock signal. The data strings comprise commands (e.g., a read command, a byte program command, a sector erase command and other commands), data (e.g., the read data and programmed data) and addresses associated with the data. The commands, each having eight-bit length, are transmitted into the SPI serial flash in four periods of the first system clock signal (or eight periods of the second system clock signal). The addresses, each having 24-bit length, are transmitted into the SPI serial flash in twelve periods of the first system clock signal (or 24 periods of the second system clock signal). Note that the term of "flash" in this specification means a non-volatile memory that can be electrically erased and reprogrammed.

For the transmission method regarding the read operation (i.e., the data strings comprise a read command, a read data, and an address associated with the read data), the transmission method of the present invention further comprises the step of providing a latency after the address is transmitted. The latency takes eight periods of the second system clock signal. Also, the latency is tunable and is dependent on an internal read speed. In another embodiment, the transmission method further comprises the steps of activating a read ready signal and outputting a read data through an output pin. The read data is outputted with each byte in eight periods of the second system clock signal.

For the transmission method regarding the program operation (i.e., the data strings comprise a program command, a programmed data, and an address associated with the programmed data), the transmission method of the present invention further comprises the steps of inputting the programmed data to the address with each byte in eight periods of the second system clock signal, inactivating a chip enable signal after the 20th period of the first system clock signal, and starting an internal program operation.

For the transmission method regarding the erase operation (i.e., the data strings comprise an erase command and an address associated with the erase command), the transmission method of the present invention further comprises the steps of inactivating a chip enable after the 16th period of the first system clock signal and starting an internal erase operation.

BRIEF DESCRIPTION OF THE DRAWINGS

The invention will be described according to the appended drawings in which.

DETAILED DESCRIPTION OF THE INVENTION

Figure 1:
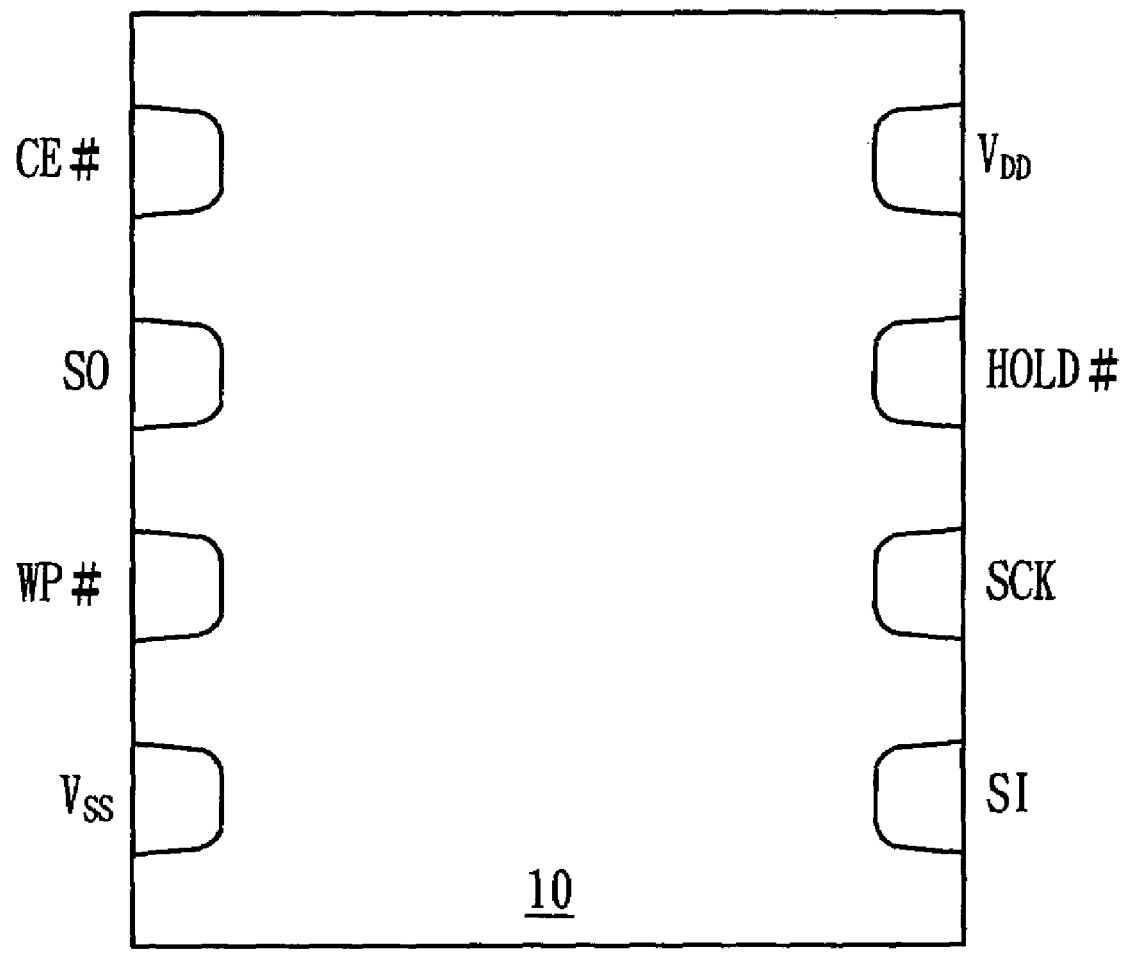
FIG. 1 shows the pin assignment of an SPI serial flash.
Figure 2:
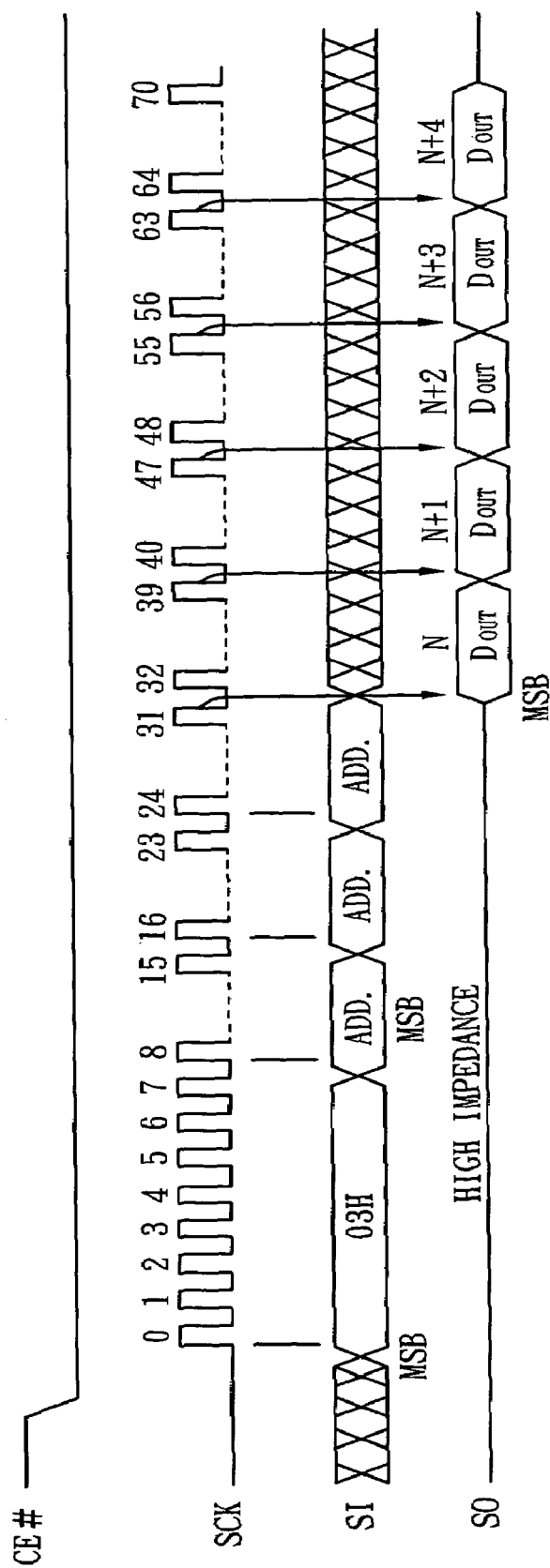
FIG. 2 shows a known read sequence of the SPI serial flash.
Figure 3:
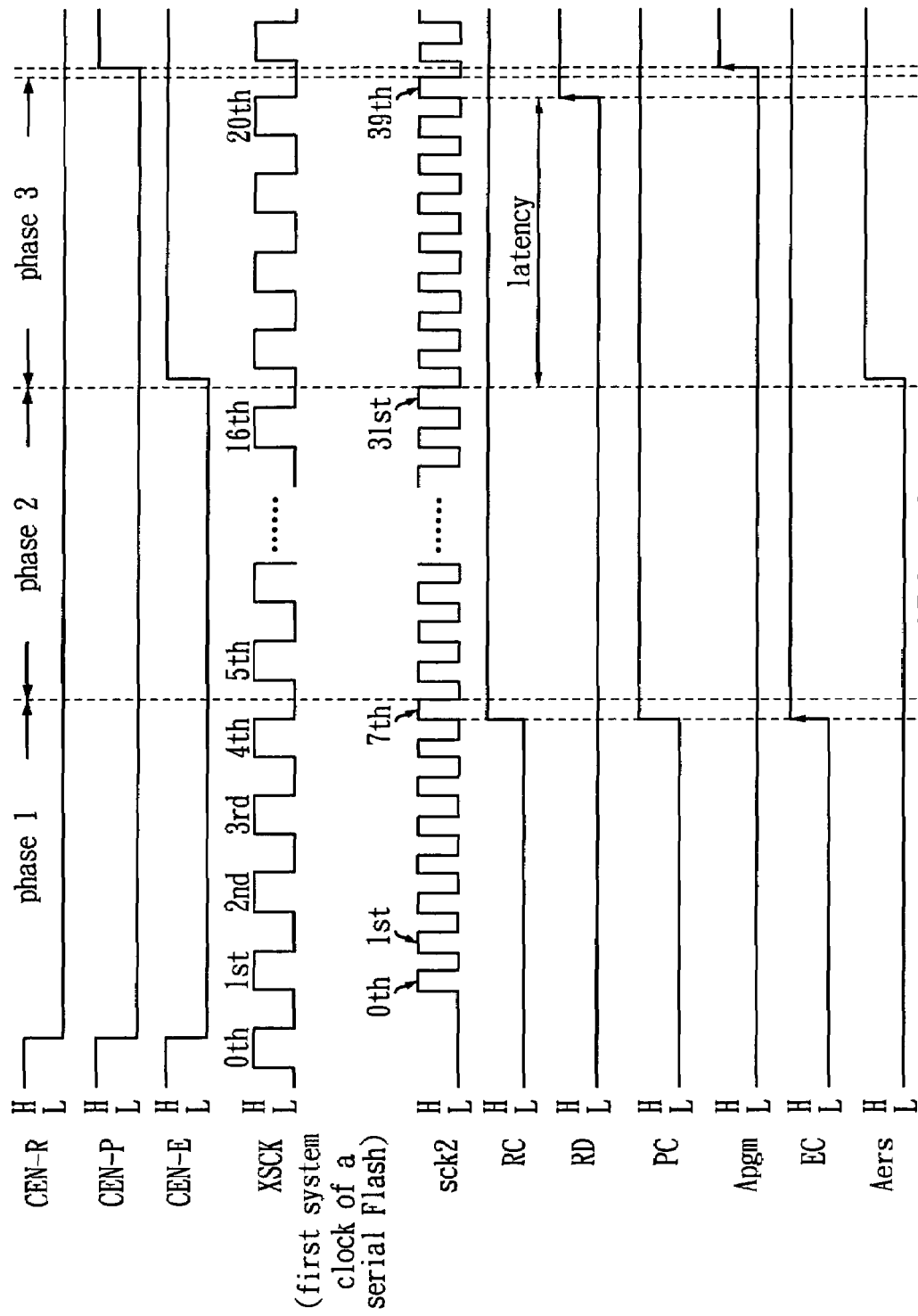
FIG. 3 shows a timing chart regarding an embodiment of the transmission method according to the present invention.

FIG. 3 shows a timing chart regarding an embodiment of the transmission method according to the present invention, which includes the read operation, the program operation, and the erase operation. A first system clock signal XSCK with a first frequency is provided by an external clock circuit; a second system clock signal sck2 with a second frequency is formed by doubling the first frequency and then plural data strings are transmitted, in which each bit data of the data strings are transmitted in a period of the second system clock signal XSCK. In FIG. 3, the data strings comprise three groups of data strings. The first group of data strings includes a read command transmitted in Phase 1, and a read address transmitted in Phase 2. The second group of data strings includes a program command transmitted in Phase 1, a program address transmitted in Phase 2, and programmed data transmitted in Phase 3. The third group of data strings includes an erase command transmitted in Phase 1, and an erase address transmitted in Phase 2. The second system clock signal sck2 is generated at the rising edges and the falling edges of the first system clock signal XSCK. However, in another embodiment, the second system clock signal sck2 could be generated to lag the first system clock signal XSCK by a predetermined duration. The input command data (i.e., the read command, the program command, or the erase command), the addresses associated with the input command data and programmed data align to the rising edges and the falling edges of the first system clock signal XSCK to define a setup time and a hold time. In addition, the transmission method of the present invention further comprises the step of determining the data strings after the fourth period of the first system clock signal XSCK (refer to the period labeled as 4th of XSCK in FIG. 3), in which the data strings will be determined to be a read command, a program command, or an erase command. Note that because the chip enable signal CEN-R, CEN-P, or CEN-E is not activated low before the period labeled as 0th of XSCK, the period labeled as 0th of XSCK is not considered as the first period of XSCK.

For the read operation, the transmitted data strings comprise an eight-bit read command, read data, and a 24-bit address associated with the read data. First, the chip enable signal CEN-R for the read operation switches to a low logic state. The first rising edge of the first system clock signal XSCK is recognized by the read command and activates the second system clock signal sck2. The read command is transmitted, with a signal RC at a low logic state, into the SPI serial flash from period 1 to period 4 of the first system clock signal XSCK, or from period 0 to period 7 of the second system clock signal sck2, in Phase 1. That is, it takes four periods of the first system clock signal XSCK to transmit the read command. Then, the signal RC switches to a high logic state and the 24-bit address is transmitted into the SPI serial flash from period 5 to period 16 of the first system clock signal XSCK, or from period 8 to period 31 of the second system clock signal sck2, in Phase 2. That is, it takes 24 periods of the second system clock signal sck2 to transmit the 24-bit address. A latency shown in FIG. 3, which takes eight periods of the second system clock signal sck2, is provided to allow the read data to be read from the accessed memory cells. However, the latency is tunable and is dependent on an internal read speed. After the latency, a read ready signal RD is activated to a high logic state to output the read data through an output pin.

Figure 4:
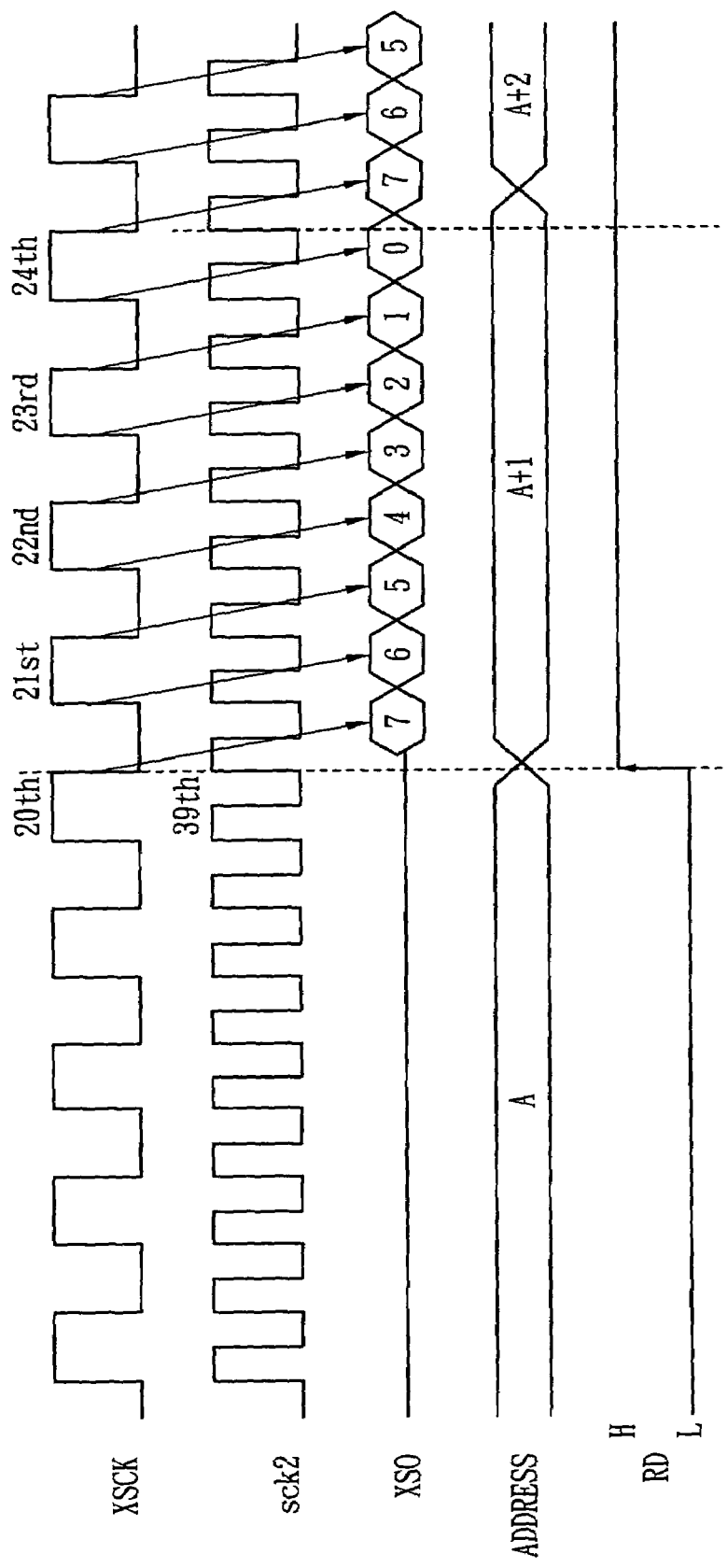
FIG. 4 shows a timing chart regarding the output of the read data in accordance with an embodiment of the present invention.

FIG. 4 shows a timing chart regarding the output of the read data in accordance with an embodiment of the present invention. Referring to FIGS. 3 and 4, the read data in address A has already been latched at the falling edge of the 20th period of the first system clock signal XSCK. When the read ready signal RD is activated to the high logic state, the read data in address A is outputted through the output pin XSO in bits over four periods of the first system clock signal XSCK (i.e., over eight periods of the second system clock signal sck2); at the same time, another read data is being accessed in address (A+1). The read operation will continue until the chip enable signal CEN-R switches to the high logic state. Note that the rising edges and the falling edges of the first system clock signal XSCK are effective edges for the read data. As a result, the data output rate is doubled.

Referring back to FIG. 3, for the program operation, the transmitted data strings comprise an eight-bit program command, programmed data, and a 24-bit address associated with the programmed data. At first, the chip enable signal CEN-P for the program operation switches to a low logic state. The first rising edge of the first system clock signal XSCK is recognized by the program command and activates the second system clock signal sck2. The program command is transmitted, with a signal PC at a low logic state, into the SPI serial flash from period 1 to period 4 of the first system clock signal XSCK, or from period 0 to period 7 of the second system clock signal sck2, in Phase 1. That is, it takes four periods of the first system clock signal XSCK to transmit the program command. Then, the signal PC switches to a high logic state and the 24-bit address is transmitted into the SPI serial flash from period 5 to period 16 of the first system clock signal XSCK, or from period 8 to period 31 of the second system clock signal sck2, in Phase 2. That is, it takes twelve periods of the first system clock signal XSCK to transmit the 24-bit address. After the 24-bit address is transmitted (i.e., after period 16 of the first system clock signal XSCK), the programmed data is transmitted (or inputted) into the SPI serial flash with each byte in four periods of the first system clock signal XSCK. Then, the chip enable signal CEN-P switches to the high logic state to activate a program ready signal Apgm to start an internal program operation.

For the erase operation, the transmitted data strings comprise an eight-bit erase command and a 24-bit address associated with the erase command. At first, the chip enable signal CEN-E for the erase operation switches to a low logic state. The first rising edge of the first system clock signal XSCK is recognized by the erase command and activates the second system clock signal sck2. The erase command is transmitted, with a signal EC at a low logic state, into the SPI serial flash from period 1 to period 4 of the first system clock signal XSCK, or from period 0 to period 7 of the second system clock signal sck2, in Phase 1. That is, it takes four periods of the first system clock signal XSCK to transmit the erase command. Then, the signal EC switches to a high logic state and the 24-bit address is transmitted into the SPI serial flash from period 5 to period 16 of the first system clock signal XSCK, or from period 8 to period 31 of the second system clock signal sck2, in Phase 2. That is, it takes twelve periods of the first system clock signal XSCK to transmit the 24-bit address. After the 24-bit address is transmitted (i.e., after period 16 of the first system clock signal XSCK), the chip enable signal CEN-E switches to the high logic state to activate an erase ready signal Aers to start an internal erase operation.

The transmission method regarding the read, program and erase operations shown in FIG. 3 indicates that each two-bit data of the data strings is transmitted using the falling edge and the rising edges of the first system clock signal. However, in another embodiment of the present invention using the falling edges of the second system clock signal sck2 or using the falling (or rising) edges of the second system clock signal sck2 that is shifted, the transmission of the each two-bit data of the data strings will not be limited to the falling and rising edges of the first system clock signal XSCK. Also, the data strings are not limited to the read, program, and erase commands. Any data strings (e.g., page program command, auto address increment programming command, write enable command, write disable command, read command, erase command, and so on) inputted into or outputted from the SPI serial flash can utilize the transmission method, using the DDR technique, of the present invention to improve the transmission rate.

According to the above embodiments, not only the data output rate but also the command input rate, the address input rate as well as the programmed data input rate are improved; therefore, the expected objective of the present invention is achieved.

The design technique used in DDR DRAM can be applied to DDR SPI flash. The differential input can be used. The phase lock loop circuit can be used to synchronize the second system clock to the rising and falling edge of the first system clock.

The above-described embodiments of the present invention are intended to be illustrative only. Numerous alternative embodiments may be devised by those skilled in the art without departing from the scope of the following claims.

What is claimed is:

1. A transmission method for a serial periphery interface (SPI) serial flash, comprising the steps of:
   providing a first system clock signal with a first frequency;
   doubling the first frequency of the first system clock signal to form a second system clock signal with a second frequency; and
   transmitting a plurality of data strings bit by bit permanently with the second system clock signal,
   wherein the data strings comprise a read command and an address, which are transmitted through an input pin, and
   the read command and the address are transmitted into the SPI serial flash in eight periods and twenty-four periods, respectively, of the second system clock signal.

2. The transmission method of claim 1, further comprising the step of providing a latency after the address is transmitted.

3. The transmission method of claim 2, wherein the latency is tunable and is dependent on an internal read speed.

4. The transmission method of claim 2, wherein the latency takes eight periods of the second system clock signal.

5. The transmission method of claim 1, further comprising the steps of:
   activating a read ready signal; and
   outputting read data through an output pin.

6. The transmission method of claim 1, wherein the data stored in the address is outputted with each byte in eight periods of the second system clock signal.

7. A transmission method for a serial periphery interface (SPI) serial flash, comprising the steps of:
   providing a first system clock signal with a first frequency;
   doubling the first frequency of the first system clock signal to form a second system clock signal with a second frequency; and
   transmitting a plurality of data strings bit by bit permanently with the second system clock signal,
   wherein the data strings comprise a program command, an address, and programmed data, and
   the program command and the address are transmitted to the SPI serial flash in eight and 24 periods, respectively, of the second system clock signal.

8. The transmission method of claim 7, further comprising the step of inputting the programmed data to the address with each byte in eight periods of the second system clock signal.

9. The transmission method of claim 8, further comprising the steps of:
   activating a program ready signal; and
   starting an internal program operation.

10. A transmission method for a serial periphery interface (SPI) serial flash, comprising the steps of:
    providing a first system clock signal with a first frequency;
    doubling the first frequency of the first system clock signal to form a second system clock signal with a second frequency; and
    transmitting a plurality of data strings bit by bit permanently with the second system clock signal,
    wherein the data strings comprise an erase command and an address, and
    the erase command and the address are transmitted into the SPI serial flash in eight periods and 24 periods, respectively, of the second system clock signal.

11. The transmission method of claim 10, further comprising the steps of:
    activating an erase ready signal; and
    starting an internal erase operation.

12. The transmission method of claim 10, wherein the second system clock signal is generated at the rising edges and the falling edges of the first system clock signal.

13. The transmission method of claim 10, wherein the data strings comprise input command data, an address and programmed data, which align to the rising edges and the falling edges of the first system clock signal to define a setup time and a hold time.

14. The transmission method of claim 10, wherein the each two-bit data is transmitted using the falling edge and the rising edge of the first system clock signal.

15. The transmission method of claim 10, further comprising the step of determining the data strings after the fourth period of the first system clock signal.

* * * * *